(12) United States Patent
Sandhu

(10) Patent No.: US 6,436,246 B1
(45) Date of Patent: Aug. 20, 2002

(54) COLLIMATED SPUTTER DEPOSITION MONITOR USING SHEET RESISTANCE

(75) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/788,980

(22) Filed: Jan. 27, 1997

(51) Int. Cl.[7] .................. C23C 14/34; C23C 16/00; G01R 31/26
(52) U.S. Cl. .............. 204/192.13; 204/298.08; 324/719; 427/8; 427/10; 118/712
(58) Field of Search .............. 204/192.13, 192.35, 204/298.11, 192.12, 192.17, 192.2, 192.22, 192.3; 216/17, 18, 39; 438/694, 697, 700; 427/8, 10; 324/719

(56) References Cited

U.S. PATENT DOCUMENTS

| | | | | |
|---|---|---|---|---|
| 3,374,112 A | * | 3/1968 | Danon | 204/192.13 |
| 3,456,186 A | * | 7/1969 | Bush et al. | 324/719 |
| 4,311,725 A | * | 1/1982 | Holland | 204/192.13 |
| 4,357,203 A | * | 11/1982 | Zelez | 204/192.32 |
| 4,824,802 A | * | 4/1989 | Brown et al. | 437/192 |
| 5,032,233 A | * | 7/1991 | Yu et al. | 204/192.15 |
| 5,071,791 A | * | 12/1991 | Inoue et al. | 204/192.15 |
| 5,171,412 A | * | 12/1992 | Talieh et al. | 204/298.11 |
| 5,245,794 A | * | 9/1993 | Salugsugan | 451/10 |
| 5,330,628 A | * | 7/1994 | Demaray et al. | 204/298.11 |
| 5,478,455 A | * | 12/1995 | Actor et al. | 204/192.13 |
| 5,639,357 A | * | 6/1997 | Xu | 204/192.3 |
| 5,665,214 A | * | 9/1997 | Iturralde | 204/192.13 |
| 5,665,659 A | * | 9/1997 | Lee et al. | 204/192.22 |
| 5,698,989 A | * | 12/1997 | Nulman | 324/719 |
| 5,705,042 A | * | 1/1998 | Leiphart et al. | 204/192.3 |
| 5,711,858 A | * | 1/1998 | Kontra et al. | 204/192.15 |
| 5,723,367 A | * | 3/1998 | Wada et al. | 204/192.3 |

OTHER PUBLICATIONS

Chapman, Glow Discharge Processes (1980); John Wiley & Sons, New York; pp. 234, 248 and 299–305.*

* cited by examiner

Primary Examiner—Nam Nguyen
Assistant Examiner—Gregg Cantelmo
(74) Attorney, Agent, or Firm—Fletcher, Yoder & Van Someren

(57) ABSTRACT

A method and apparatus are disclosed for electrically monitoring processing variations of a material deposited using a collimated process. In one embodiment, the method and apparatus are directed to monitoring variations in step coverage of a conductive material deposited using a collimated sputtering process. A substrate having a plurality of trenches is used to mimic features desired to be monitored, such as contact holes. The resistance of metal deposited into the trenches is monitored to determine the effectiveness of the collimated sputtering process.

38 Claims, 4 Drawing Sheets

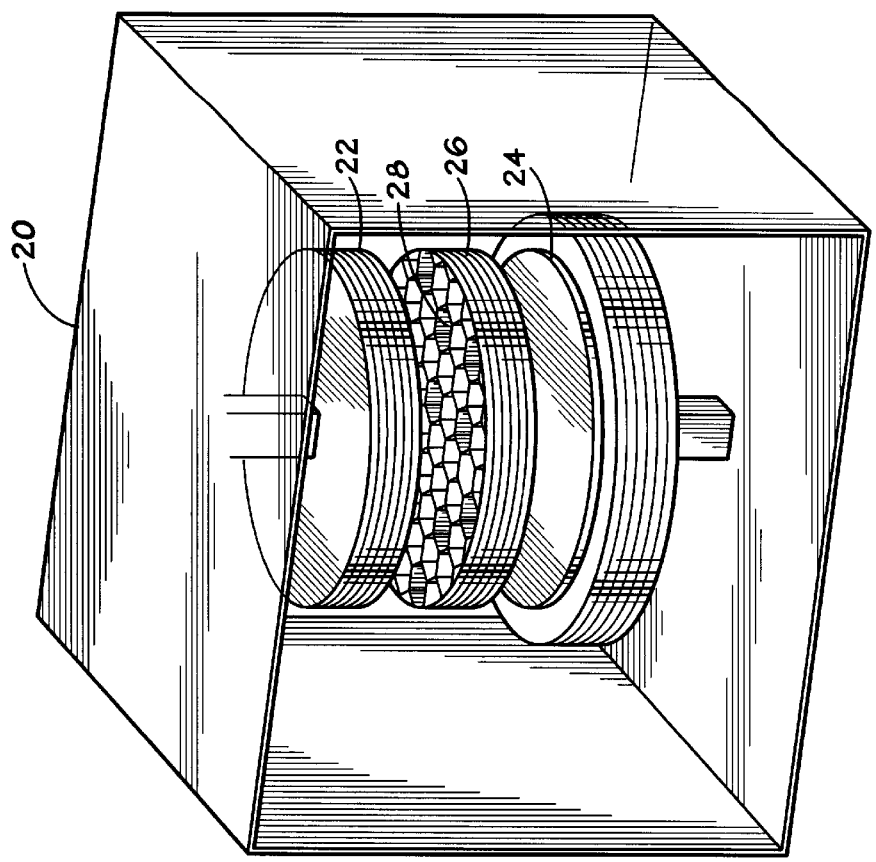
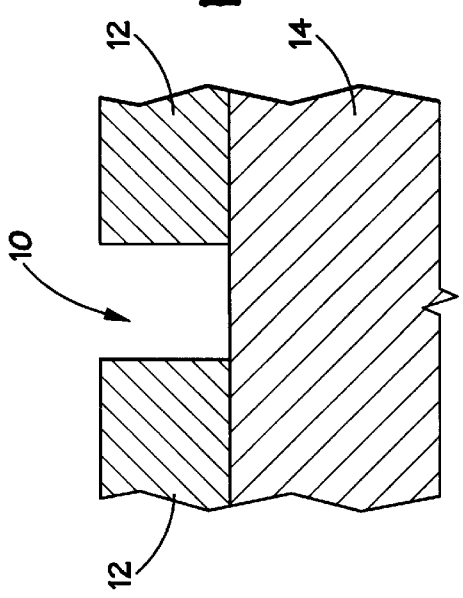
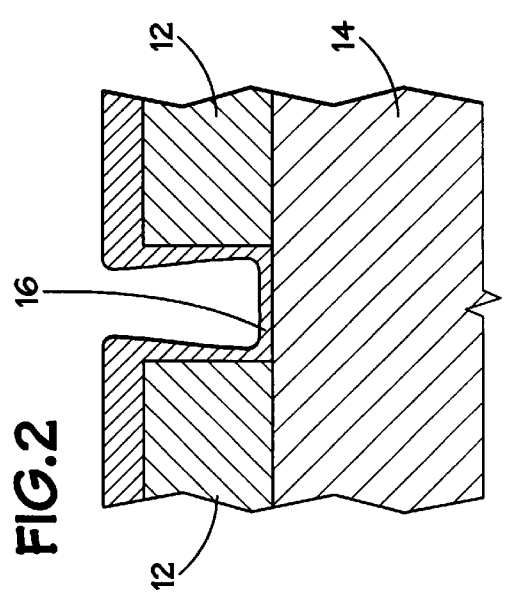

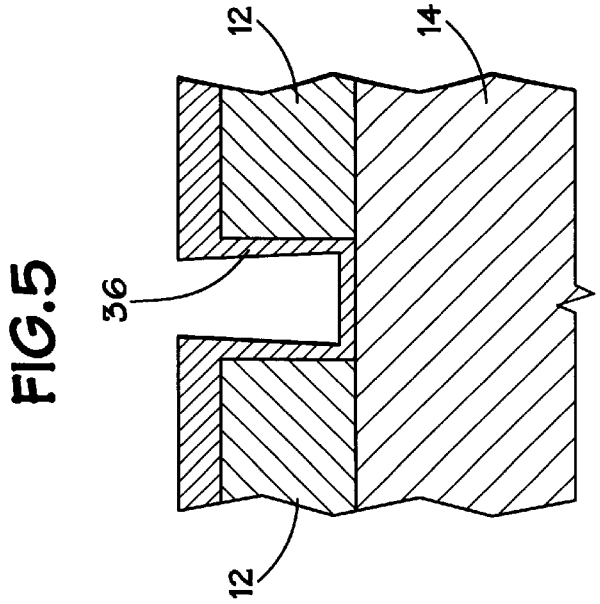
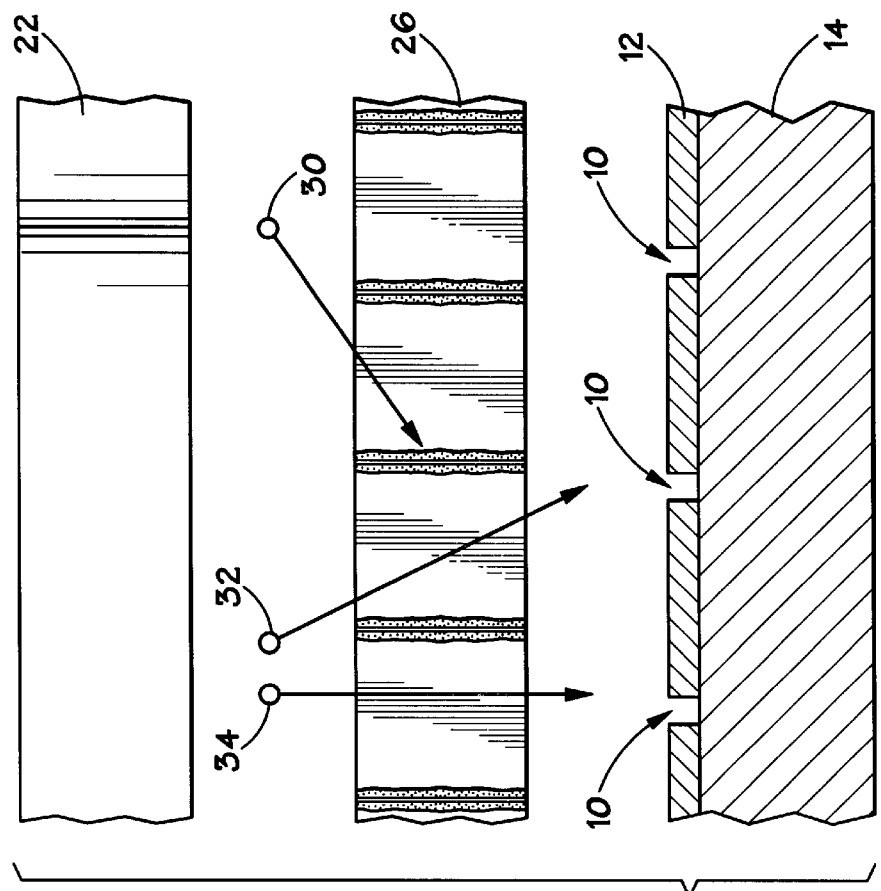

COLLIMATED SPUTTER DEPOSITION MONITOR USING SHEET RESISTANCE

BACKGROUND OF THE INVENTION

1. Field of the Invention

This invention relates generally to the field of integrated circuit manufacturing and, more particularly, to a method for monitoring processing variations in sputtered metallic films.

2. Description of the Related Art

For many years, metal sputtering has been used to form films on semiconductor wafers. Although sputtering is generally regarded as a cost effective way to deposit metal on a semiconductor wafer, sputtering techniques have suffered from technical drawbacks in the Ultra-Large-Scale-Integration (ULSI) era. Most significantly, it is becoming increasingly difficult to sputter metals into contact holes. The aspect ratio of a contact hole is determined by dividing the contact hole's height by its diameter. In the ULSI era, aspect ratios of contact holes are growing larger as the diameters shrink. As a result, it has become increasingly more difficult to sputter metals, such as titanium, into the bottom of the contact holes. Inadequate metal formation at the bottom of a contact hole produces a contact with an undesirably high resistance.

A collimated sputtering process has been used to achieve better uniformity at the bottom of contact holes because such a process directs the deposited metal in a substantially perpendicular manner onto the surface of the wafer. In a collimated sputtering process, a collimator is placed between a metal target and a wafer. The collimator contains holes through which liberated atoms from the metal target must pass to reach the wafer. Atoms having trajectories substantially perpendicular to the wafer pass through the collimator, while atoms having undesired trajectories accumulate on the walls of the collimator.

While collimation provides for contacts with better coverage at the bottom of the contact holes, the technique does suffer from the drawback that the inside walls of the collimator become coated with the metal atoms. Over time, the build-up on the walls changes the effective trajectory of the atoms that are able to proceed to the wafer surface and affects the profile of the metal film so deposited. Once this build-up becomes severe, the collimator is cleaned or changed. However, there is no method or apparatus to monitor the status of the collimator to determine when to clean or change it.

The present invention is directed to overcoming, or at least reducing the affect of, one or more of the problems set forth above.

SUMMARY OF THE INVENTION

In accordance with one aspect of the present invention there is provided a method for fabricating a monitor for monitoring processing variations of a conductive material. The method includes the steps of: (a) forming a plurality of trenches on a substrate; (b) disposing a conductive material into the plurality of trenches; (c) placing two terminals in contact with the conducting material; and (d) coupling the two terminals to a resistance measuring device.

In accordance with another aspect of the present invention, there is provided a method for monitoring step coverage of a conductive material. A substrate having a plurality of trenches is placed in a deposition chamber. A conductive material is disposed into the plurality of trenches. Two terminals are placed in contact with the conductive material. A resistance is measured between the two terminals.

In accordance with a further aspect of the present invention, there is provided a method for monitoring step coverage of a conductive material to be deposited onto a production wafer containing contact holes having a given aspect ratio. The production wafer is placed into a deposition chamber. A test wafer having a plurality of trenches is placed into the deposition chamber. The trenches have an aspect ratio similar to the aspect ratio of the contact holes. Conductive material is disposed into the trenches. Two terminals are coupled to the conductive material, and a resistance is measured between the two terminals.

In accordance with yet another aspect of the present invention, there is provided an apparatus for monitoring processing variations of a conductive material relative to a given feature. The apparatus includes a substrate having a plurality of parallel trenches. The trenches have an aspect ratio correlative to a given aspect ratio of the given feature.

In accordance with still another aspect of the present invention, there is provided an apparatus for monitoring processing variations of a conductive material relative to a given feature. The apparatus includes a substrate having a plurality of parallel trenches. The trenches have an aspect ratio correlative to a given aspect ratio of the given feature. The trenches have a conductive material disposed therein. Two terminals are coupled to the conductive material.

In accordance with a still further aspect of the present invention, there is provided an apparatus for monitoring processing variations of a conductive material relative to a given feature. The apparatus includes a substrate having a plurality of parallel trenches. The trenches have an aspect ratio correlative to a given aspect ratio of the given feature. A conductive material is disposed in the trenches. Two terminals are coupled to the conductive material, and a resistance measuring device is coupled to the two terminals.

BRIEF DESCRIPTION OF THE DRAWINGS

The foregoing and other advantages of the invention will become apparent upon reading the following detailed description and upon reference to the drawings in which:

FIG. 1 is a cross section of a contact hole;

FIG. 2 is a cross section of a contact hole which is filled with metal and which has relatively poor metal coverage at the bottom of the contact hole;

FIG. 3 is a schematic representation of a metal deposition machine showing the location of a collimator;

FIG. 4 is a cross section of the target, collimator, and wafer;

FIG. 5 is a cross section of a contact hole which is filled with metal sputtered through a collimator and which exhibits better metal coverage at the bottom of the contact hole than FIG. 2;

Figure 8:
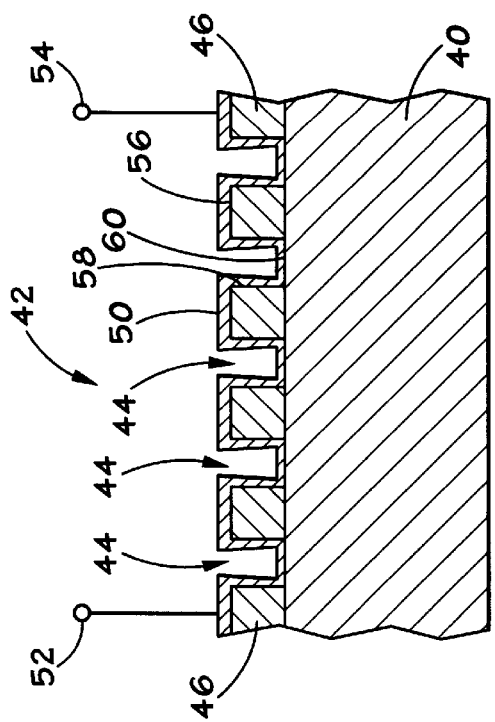
FIG. 8 is a cross section of the trenched structure showing the location of the test terminals which measure the resistance of the metal sputtered over the trenched structure.

While the invention is susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the appended claims.

DETAILED DESCRIPTION OF THE SPECIFIC EMBODIMENTS

For purposes of the present discussion, the exemplary methods and apparatus are described as being particularly useful for monitoring the deposition of conductive material in a sputtering deposition process, such as collimated sputtering deposition. However, it should be readily understood that the methods and apparatus described and claimed herein are useful for monitoring processing variations of a conductive material regardless of the particular type of deposition process selected.

Referring to FIG. 1, a cross sectional view of a contact hole 10 is shown. The contact hole 10 has been etched, for example, into an oxide film 12 which has been deposited on a substrate, such as a semiconductor wafer 14. As mentioned previously, inadequate metal formation at the bottom of a contact hole produces a contact with an undesirably high resistance. An example of a contact 16 that exhibits poor metal coverage at the bottom of the contact hole 10 is shown in FIG. 2.

A collimated sputtering process may be used to achieve better uniformity of metal at the bottom of contact holes 10 because such a process directs the deposited metal in a substantially perpendicular manner onto the surface of the wafer 14. This process can best be understood with reference to FIG. 3, which shows the basic internal components of a metal sputtering chamber 20. Reactive gas is fed into the chamber 20. A plasma is produced in the gas between a metal target 22 and the wafer 14 by forming a sufficiently high electrical potential difference between the metal target 22 and the wafer 14. This causes the ions produced in the plasma to bombard into the metal target 22, thus liberating metal atoms from the metal target 22. The liberated metal atoms then fall onto the surface of wafer 14.

A collimator 26 is placed between the metal target 22 and the wafer 24. The collimator 26 typically has a hexagonal, or "honey comb", hole pattern 28 built into it. The liberated atoms move through the collimator 26 to reach the wafer 41. To understand how the collimated process achieves a more uniform contact fill, one should first note that the various metallic atoms that are liberated from the metal target 22 typically have different trajectories as a result of the relatively chaotic liberation process. The collimator 26 ensures that only liberated atoms that have trajectories substantially perpendicular to wafer 14 will be deposited onto the wafer 24.

Three such liberated atoms 30, 32, and 34 are shown FIG. 4. Also shown in FIG. 4 is the metal target 22, a cross section of the collimator 26, and the wafer 24. The wafer 24 contains a number of contact holes 10 that are to be filled with the metal atoms liberated from the metal target 22. The atom 30 has an angle incident to wafer 14 is relatively shallow. Thus, the atom 30 runs into the walls of the collimator 26 and does not make its way onto the wafer 14. The atom 32, by contrast, whose angle incident to the wafer 14 is relatively steep, e.g., substantially perpendicular, compared to that of the atom 30, passes though the collimator 32 and is deposited onto the wafer 14. Of course, the atom 34 traveling perpendicularly to the wafer 14 passes easily through the collimator 26 and impacts the wafer 24. Generally, the size of the hexagonal holes and the thickness of the collimator 26, i.e., the aspect ratio of the collimator's holes, determine whether an atom traveling at a non-perpendicular angle relative to the wafer 24 impacts the wafer 24.

Selecting liberated atoms having substantially perpendicular trajectories through this means assists in filling the bottoms of the contact holes 10. Without some means of producing atoms that travel substantially perpendicularly to the sides of the contact holes 10, atoms having shallow trajectories would accumulate on the sides of the contact holes 10, thus leaving the bottom of the contact holes 10 wholly or partially unfilled. However, using the collimator 26, atoms having undesired trajectories accumulate on the walls of the collimator 26 instead of on the walls of the contact holes 10. In fact, in an ideal collimated process, the aspect ratios of the holes in the collimator 26 are roughly the same as the aspect ratios of the contact holes 10 that are to be filled. Accordingly, metal formed by collimated deposition produces a contact 36 with improved metal coverage, as shown in FIG. 5. While commercial metal sputterers with collimators 26 exist, standard metal deposition chambers can be modified to include a collimator 26 by spacing the metal target 22 from the wafer 14 and by adequately harnessing the collimator 26 to the metal sputtering chamber 20.

Although collimation produces contacts that have better metal coverage at the bottom of the contact holes 10, the technique does suffer from the drawback that the inside walls of the collimator 26 become coated with atoms having shallow trajectories. Over time, the build-up on the walls changes the effective trajectory of the atoms that are able to proceed to the wafer surface and affects the profile of the metal film so deposited. Once this build-up becomes severe, the collimator 26 is cleaned or changed.

Figure 6:
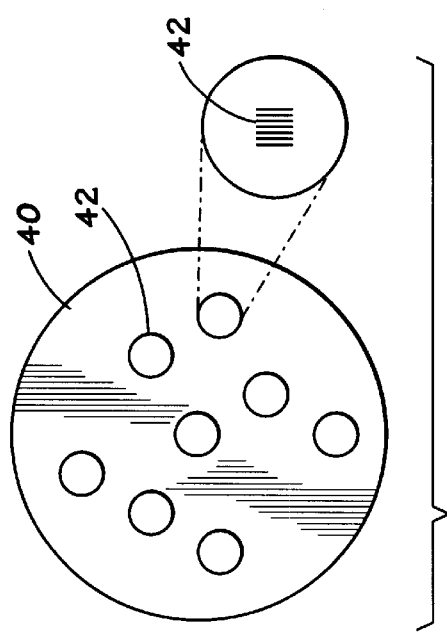
FIG. 6 is a plan view of a wafer having a plurality of trenched structures.

To facilitate the collimation process, a wafer having a test structure may be provided to monitor this build-up. In one embodiment, a test wafer is included along with actual production wafers during the metal sputtering process to provide a convenient means for monitoring process variations, such as metal step coverage, on the production wafers. However, the test structure may be formed at one or more locations on a production wafer to monitor the metal step coverage on the production wafer. Referring to FIG. 6, such a wafer is shown and designated by a reference numeral 40. The wafer 40, which may be a production wafer or a test wafer, may contain one or more trenched structures 42, one of which is shown in the exploded view of FIG. 6.

Figure 7:
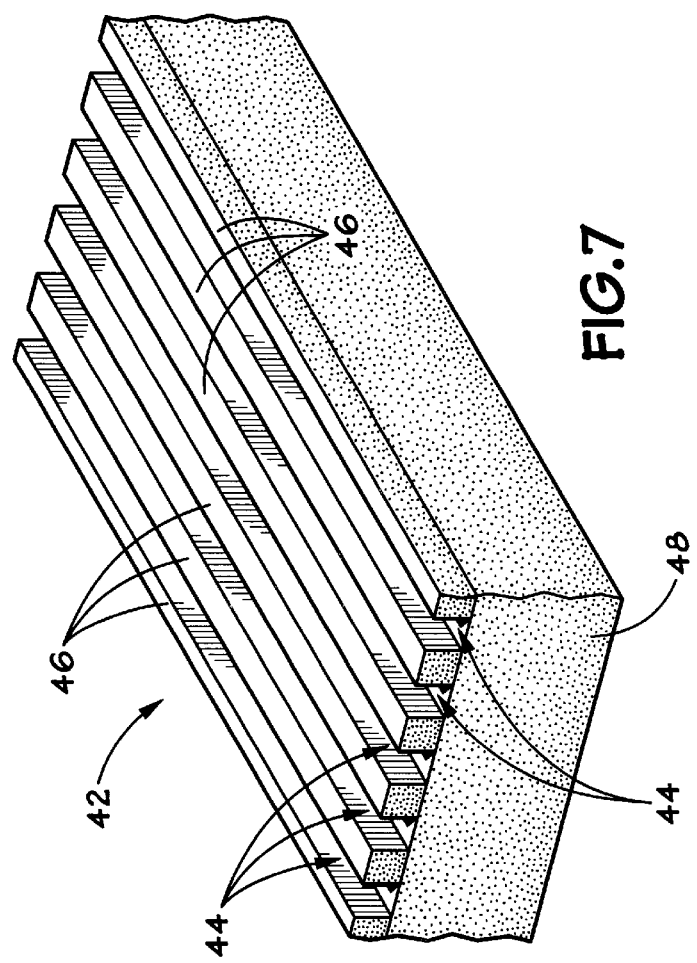
FIG. 7 is a three-dimensional perspective view of the trenched structure used in the disclosed process.

The trenched structure 42 includes a plurality of trenches 44, as illustrated in FIG. 7. To form the trenched structure 42, an oxide layer 46 is deposited onto a wafer 40. Next, the trenches 44 are etched, e.g., anisotropically, into the oxide layer 46. The trenches 44 are etched such that the height of the trench 44 divided by the width of the trench 44 substantially equals or exceeds the aspect ratio of the contact holes 10 that are used in the process to be monitored. In this way, the trenched structure 42 on the wafer 40 mimics an important parameter of the contacts holes 10 in the actual process, i.e., their aspect ratio. In this embodiment, the trenches 44 are approximately two microns in height.

The metal 50 whose variation is to be measured is sputtered using a collimated process as described previously onto the surface of the wafer 40, as shown in FIG. 8. Because the trenches 44 have approximately the same aspect ratio as the contact holes 10 on a production wafer, the metal 50 assumes a shape inside of the trenches 44 that mimics that of a contact hole 10 in the production wafer.

The electrical resistance of the metal 50 on a particular trenched structure 42 is measured across the trenched structure 42 between the terminals 52 and 54. It should be noted that individual trenched structure 42 on the wafer 40 are advantageously electrically isolated from one another so that metal on the intervening surface of the wafer 40 does not influence the results of the resistance measurement. The terminals 52 and 54 on each trenched structure 42 are advantageously located such that they form a line that is substantially perpendicular to the trenches 44. The number of trenches 44 between the terminals 52 and 54 could be numerous, perhaps well into the thousands.

By measuring the resistance between the terminals 52 and 54, the step coverage of the metal 50, particularly the amount of metal at the bottom of the trenches 44, can be monitored. This is true because the thickness of the metal 50 over all surfaces of the trenched structure 42, i.e., the surfaces 56, 58, and 60, affect the resistance measurement. However, experience from the use of the collimated sputtering technique reveals that the thickness of the metal 50 at the top surfaces 56 is not expected to vary much and, therefore, will not affect the resistance measurement. However, as previously discussed, build-up on the sides of the collimator 26 can cause, in particular, changes in metal deposition at the side and bottom surfaces 58 and 60 of the trenches 44. Therefore, the thickness of the metal 50 at the side and bottom surfaces 58 and 60 should be the dominate factor in the resistance measurement. Accordingly, the resistance measurement can be used to monitor the relative thickness of the metal 50 at the bottom of trenches 44.

An increase in the resistance over a baseline value for a metal that exhibits proper step coverage indicates that the metal 50 is undesirably thin and, thus, suggests that the step coverage is inadequate. This is true because thinner metal is higher in resistance than thicker metal. By monitoring the resistance measurement, the process engineer can know when the metal deposition process is no longer properly filling the contact holes 10. The resistance of the trenched structure 42 may be accomplished using several means, including utilization of probe needles connected to an ohmmeter. Likewise, a four-point probe methodology could also be used. To monitor the sputtering process as a function of time, and to establish a baseline resistance value for a properly sputtered metal, the terminals 52 and 54 of different trenched structures 42 on the wafer 40 are spaced by the same distance, i.e., that they span the same number of trenches 44. Also, to ensure that the trenched structure 42 dominates the resistance measurement, the trenches 44 are advantageously sufficiently long in comparison to the distance between the terminals 52 and 54.

As already noted, the disclosed method is designed to be used "in line" such that the test or production wafers 40 with the trenched structures 42 etched into them can be inserted in the metal sputtering production step along with production wafers that contain no trenched structures. However, a test wafer 40 can be run without the presence of production material, and the sputtering process might be monitored instead on a bi-weekly basis, for example.

Figures 9, 10:
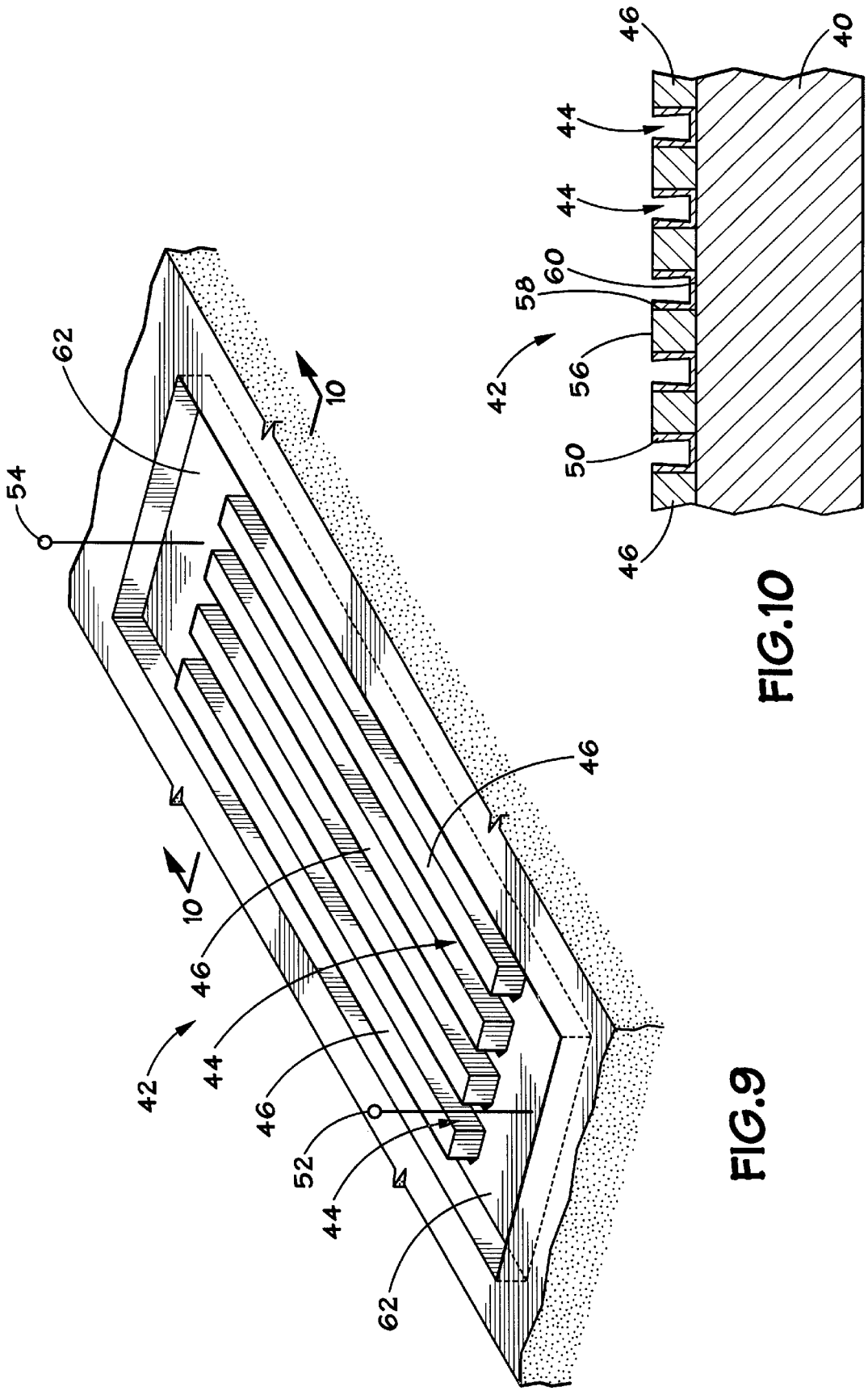
FIG. 9 is a three-dimensional perspective view of an alternative embodiment which allows for the monitoring of metal deposition where the metal's resistance is to be measured parallel to the trenches in the test structure.
FIG. 10 is a cross section of the structure in FIG. 8 after metal deposition and removal of the metal from the top surfaces of the structure by the use of a Chemical-Mechanical process (CMP).

An alternative embodiment allows for the metal 50 to have its resistance monitored in a direction parallel to the trenches 44. For ease of discussion and illustration, like reference numerals are used to refer to similar elements of this alternative embodiment. As shown in FIG. 9, a similar trenched structure 42 is used as in the first embodiment, although for this embodiment the ends of the trenched structure 42 will be described in more detail. Using the same etch as is used to form the trenches 44 in the oxide 46, an area 62 of the oxide 46 is etched at each end of the trenches 44. The actual physical area of the areas 62 can vary according to the number of trenches 44 to be tested, but should be at least big enough to allow a resistance measuring probe or the terminals 52 and 54 to be seated into the two areas 62.

The metal 50 desired to be monitored is deposited over the entire trenched structure 42. Then, the metal 50 is removed from the top of the structure 42, leaving metal 50 only in the trenches 44, as illustrated in FIG. 10, and at the bottom of the two areas 62. The metal 50 at the bottom of the area 62 acts as bond pads for the resistance measuring probes. The metal 50 can be removed from the top surface 56 of the trenched structure 42 through Chemical-Mechanical Polishing (CMP) or other suitable process. With the structure 42 so completed, resistance measuring probes or the terminals 52 and 54 are placed into the two areas 62 at the ends of the trenches 44 and the resistance is measured in the same manner as described above. As shown in FIG. 10, because the metal 50 only remains on the side and bottom surfaces 58 and 60 of the trenched structure 42, this metal 50 dictates the measured resistance of the trenched structure 42. Because changes in the collimated sputtering process typically only affect the amount of the metal 50 on the side and bottom surfaces 58 and 60, changes in the measured resistance of the trenched structure 42 correlate to the thickness of the metal 50 on the side and bottom surfaces 58 and 60, thereby providing a monitor that will allow the process engineer to determine when and if the collimated sputtering process has been adversely affected.

Although the embodiments described herein are particularly useful for monitoring the deposition of sputtered metals by collimated means, the teachings may also be used to measure step coverage of a conducting material deposited by other means.

What is claimed is:

1. A method for fabricating a monitor for monitoring a processing variation of a conductive material, the method comprising the steps of:
   (a) forming a test structure having a plurality of trenches on a substrate;
   (b) disposing a conductive material into the plurality of trenches;
   (c) placing two terminals in contact with the conductive material on the test structure; and
   (d) coupling the two terminals to a resistance measuring device.

2. The method, as set forth in claim 1, wherein step (a) comprises the step of:
   forming the plurality of trenches on the substrate in parallel to one another.

3. The method, as set forth in claim 1, wherein step (a) comprises the step of:
   forming the plurality of trenches, wherein the trenches have aspect ratios correlative to an aspect ratio of a feature intended to be monitored.

4. The method, as set forth in claim 1, wherein step (a) comprises the steps of:
   disposing an oxide on the substrate; and
   anisotropically etching the plurality of trenches in the oxide.

5. The method, as set forth in claim 1, wherein step (b) comprises the step of:

disposing the conductive material into the plurality of trenches using a collimated sputtering method.

6. The method, as set forth in claim 1, wherein the conductive material is selected from the group consisting of titanium, aluminum, and copper.

7. The method, as set forth in claim 1, wherein step (c) comprises the step of:

spacing the two terminals apart by a distance of at least one trench.

8. The method, as set forth in claim 2, wherein step (c) comprises the step of:

spacing the two terminals apart by a distance of at least one trench such that the terminals define a line that is perpendicular to the plurality of parallel trenches.

9. The method, as set forth in claim 1, wherein step (c) comprises the step of:

placing the two terminals at respective ends of the plurality of trenches.

10. The method, as set forth in claim 1, wherein step (b) comprises the steps of:

disposing the conductive material onto a top surface of the substrate and covering the trenches; and removing the conductive material from the top surface of the substrate.

11. The method, as set forth in claim 1, wherein steps (a), (b), (c), and (d) are performed in the recited order.

12. The method, as set forth in claim 1, wherein step (c) comprises the steps of:

disposing the conductive material onto a top surface of the production wafer and covering the trenches, and removing the conductive material from the top surface of the substrate.

13. A method for monitoring step coverage of a conductive material, the method comprising the steps of:

(a) placing a substrate in a deposition chamber, the substrate having a test structure having a plurality of trenches;

(b) disposing a conductive material into the plurality of trenches;

(c) placing two terminals in contact with the conductive material on the test structure; and (d) measuring a resistance between the two terminals.

14. The method, as set forth in claim 13, wherein the plurality of trenches are parallel to one another.

15. The method, as set forth in claim 13, wherein step (b) comprises the step of:

disposing the conductive material into the plurality of trenches using a collimated sputtering method.

16. The method, as set forth in claim 13, wherein the conductive material is selected from the group consisting of titanium, aluminum, and copper.

17. The method, as set forth in claim 13, wherein step (c) comprises the step of:

spacing the two terminals apart by a distance of at least one trench.

18. The method, as set forth in claim 14, wherein step (c) comprises the step of:

spacing the two terminals apart by a distance of at least one trench such that the terminals define a line that is perpendicular to the plurality of parallel trenches.

19. The method, as set forth in claim 13, wherein step (c) comprises the step of:

placing the two terminals at respective ends of the plurality of trenches.

20. The method, as set forth in claim 13, wherein step (b) comprises the steps of:

disposing the conductive material onto a top surface of the substrate and covering the trenches; and removing the conductive material from the top surface of the substrate.

21. The method, as set forth in claim 13, wherein steps (a), (b), (c), and (d) are performed in the recited order.

22. A method for monitoring step coverage of a conductive material to be deposited onto a production wafer containing contact holes having a given aspect ratio, the method comprising the steps of:

(a) placing the production wafer into a deposition chamber;

(b) placing a test wafer into the deposition chamber, the test wafer having a plurality of parallel trenches, the plurality of trenches having an aspect ratio substantially identical to the given aspect ratio of the contact holes;

(c) disposing the conductive material into the plurality of parallel trenches;

(d) coupling two terminals to the conductive material; and (e) measuring a resistance between the two terminals.

23. The method, as set forth in claim 22, wherein step (d) comprises the step of:

spacing the two terminals apart by a distance of at least one trench.

24. The method, as set forth in claim 13, wherein steps (a),(b),(c), and (d) are performed in the recited order.

25. An apparatus for monitoring processing variations of a conductive material relative to a recessed feature, the apparatus comprising:

a substrate having a test structure having a plurality of parallel trenches, the plurality of trenches having an aspect ratio correlative to a given aspect ratio of the recessed feature.

26. The apparatus, as set forth in claim 25, wherein each end of the plurality of trenches terminates in a respective common area.

27. An apparatus for monitoring processing variations of a conductive material relative to a recessed feature, the apparatus comprising:

a substrate having a test structure having a plurality of parallel trenches, the plurality of trenches having an aspect ratio correlative to a given aspect ratio of the recessed feature, the plurality of trenches having the conductive material disposed therein; and two terminals coupled to the conductive material on the test structure.

28. An apparatus for monitoring processing variations of a conductive material relative to a recessed feature, the apparatus comprising:

a substrate having a test structure having a plurality of parallel trenches, the plurality of trenches having an aspect ratio correlative to a given aspect ratio of the recessed feature, the plurality of trenches having the conductive material disposed therein;

two terminals coupled to the conductive material on the test structure; and a resistance measuring device coupled to the two terminals.

29. A method for fabricating a monitor for monitoring a processing variation of a conductive material, the method comprising the steps of:

(a) forming a plurality of circuit structures on a production wafer;

(b) forming a test structure on the production wafer, the test structure having a plurality of trenches;

(c) disposing a conductive material into the plurality of trenches;

(d) placing two terminals in contact with the conductive material; and (e) coupling the two terminals to a resistance measuring device.

30. The method, as set forth in claim 29, wherein step (b) comprises the step of:

forming the plurality of trenches in parallel to one another.

31. The method, as set forth in claim 29, wherein step (b) comprises the step of:

forming the plurality of trenches, wherein the trenches have aspect ratios correlative to an aspect ratio of a feature intended to be monitored.

32. The method, as set forth in claim 29, wherein step (b) comprises the steps of:

disposing an oxide on the production wafer; and anisotropically etching the plurality of trenches in the oxide.

33. The method, as set forth in claim 29, wherein step (c) comprises the step of:

disposing the conductive material into the plurality of trenches using a collimated sputtering method.

34. The method, as set forth in claim 29, wherein the conductive material is selected from the group consisting of titanium, aluminum, and copper.

35. The method, as set forth in claim 29, wherein step (d) comprises the step of:

spacing the two terminals apart by a distance of at least one trench.

36. The method, as set forth in claim 30, wherein step (d) comprises the step of:

spacing the two terminals apart by a distance of at least one trench such that the terminals define a line that is perpendicular to the plurality of parallel trenches.

37. The method, as set forth in claim 29, wherein step (d) comprises the step of:

placing the two terminals at respective ends of the plurality of trenches.

38. A test structure for monitoring processing variations of a conductive material relative to a given recess, the test structure comprising:

a substrate having a plurality of parallel trenches, each end of the plurality of parallel trenches terminating in a respective common area.

* * * * *